(12) United States Patent
Bocharov et al.

(10) Patent No.: US 11,004,008 B2
(45) Date of Patent: May 11, 2021

(54) EFFICIENT TOPOLOGICAL COMPILATION FOR METAPLECTIC ANYON MODEL

(71) Applicant: Microsoft Technology Licensing, LLC, Redmond, WA (US)

(72) Inventors: Alexei Bocharov, Redmond, WA (US); Zhenghan Wang, Goleta, CA (US); Xingshan Cui, Goleta, CA (US); Vadym Kliuchnikov, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 833 days.

(21) Appl. No.: 15/563,940

(22) PCT Filed: Apr. 1, 2016

(86) PCT No.: PCT/US2016/025451
§ 371 (c)(1),
(2) Date: Oct. 2, 2017

(87) PCT Pub. No.: WO2016/161220
PCT Pub. Date: Oct. 6, 2016

(65) Prior Publication Data
US 2018/0129965 A1    May 10, 2018

Related U.S. Application Data

(60) Provisional application No. 62/141,771, filed on Apr. 1, 2015.

(51) Int. Cl.
*G06N 10/00* (2019.01)
*G06F 17/14* (2006.01)
(Continued)

(52) U.S. Cl.
CPC .......... *G06N 10/00* (2019.01); *G06F 17/145* (2013.01); *G06F 17/16* (2013.01); *G06F 30/39* (2020.01)

(58) Field of Classification Search
CPC ....... G06N 10/00; G06F 17/145; G06F 17/16; G06F 30/39
See application file for complete search history.

(56) References Cited

U.S. PATENT DOCUMENTS 9,779,359 B2 * 10/2017 Svore ................. G06N 10/00
2006/0043423 A1    3/2006 Freedman et al.
(Continued)

OTHER PUBLICATIONS

Shende et al. "Synthesis of Quantum-Logic Circuits".IEEE Transactions on Computer-Aided Design of Integrated Circuits and Systems, vol. 25, No. 6, 2006. pp. 1000-1010. (Year: 2006).*
(Continued)

*Primary Examiner* — Eunhee Kim
(74) *Attorney, Agent, or Firm* — Klarquist Sparkman, LLP

(57) ABSTRACT

Certain ensembles of metapletic anyons allow for topologically protected encoding and processing of quantum information. Such processing is done by sequences of gates (circuits) drawn from a certain basis of unitary metaplectic gates. A subject unitary operator required for the desired processing can be approximated to any desired precision by a circuit that has to be effectively and efficiently synthesized on a classical computer. Synthesis methods use unitary reflection operators that can be represented either exactly or by ancilla-assisted approximation over the basis of metaplectic gates based on cost-optimizing determinations made by the synthesis algorithm.

16 Claims, 6 Drawing Sheets

(51) Int. Cl.
*G06F 17/16* (2006.01)
*G06F 30/39* (2020.01)

(56) References Cited

U.S. PATENT DOCUMENTS

| | | |
|---|---|---|
| 2006/0091375 A1 | 5/2006 | Freedman et al. |
| 2011/0114920 A1 | 5/2011 | Roshen et al. |
| 2011/0156008 A1 | 6/2011 | Freedman et al. |
| 2012/0112168 A1 | 5/2012 | Bonderson et al. |
| 2014/0221059 A1 | 8/2014 | Freedman et al. |
| 2014/0279822 A1 | 9/2014 | Bonderson |
| 2015/0358219 A1* | 12/2015 | Kanda ............... H04L 41/0896 709/224 |
| 2016/0171368 A1* | 6/2016 | Aspuru-Guzik ....... G06N 5/003 706/46 |

OTHER PUBLICATIONS

Vitanov "Synthesis of arbitrary SU(3) transformations of atomic qutrits". Physical Review A 85, 032331 (2012). 9 Pages. (Year: 2012).*
Kliuchnikov et al. ("Asymptotically Optimal Approximation of Single Qubit Unitaries by Clifford and T Circuits Using a Constant Number of Ancillary Qubits". Physical Review Letters. PRL 110, 190502 (2013). May 10, 2013. 5 Pages. (Year: 2013).*
Jie. "Relaization of Two-Qutrit Quantum Gates with Control Pulses". Commun. Theor. Phys. (Beijing, China) 51 (2009) pp. 653-658. (Year: 2009).*
Kahn et al. "Synthesis of multi-qudit hybrid and d-valued quantum logic circuits by decomposition". Theoretical Computer Science 367 (2006) pp. 336-346 (Year: 2006).*
Bocharov et al., "Efficient Topological Compilation for Weakly-Integral Anyon Model," Journal of Quantum Physics, 11 pages (Apr. 2015).
Washington, "Introduction to Cyclotomic Fields," Springer, 1 page, (Jan. 1997).
Kliuchnikov et al., "Asymptotically Optimal Topological Quantum Compiling," available at: https://arxiv.org/pdf/1310.4150v1, 24 pages, (Oct. 15, 2013).
Ainsworth et al., "Topological Qubit Design and Leakage," *New Journal of Physics*, 13:1-15 (Jun. 30, 2011).
Anwar et al., "Qutrit Magic State Distillation," http://arxiv.org/abs/1202.2326v2, 13 pages (Jun. 8, 2012).
Bocharov et al., "Efficient Synthesis of Probabilistic Quantum Circuits with Fallback," http://arxiv.org/abs/1409.3552v2, 17 pages (Sep. 19, 2014).
Cui et al., "Universal Quantum Computation with Metaplectic Anyons," http://arxiv.org/abs/1405.7778v2, 19 pages (Jul. 16, 2014).
Cui et al., "Universal Quantum Computation with Metaplectic Anyons," http://arxiv.org/abs/1405.7778v3, 25 pages (Mar. 15, 2015).
Cui et al., "Universal Quantum Computation with Weakly Integral Anyons," http://arxiv.org/abs/1401.7096v2, 44 pages (Feb. 21, 2014).
Freedman et al., "Weakly-Coupled non-Abelian Anyons in Three Dimensions," http://arxiv.org/abs/1107.2731v1, 26 pages (Jul. 14, 2011).
Hastings et al., "Metaplectic Anyons, Majorana Zero Modes, and their Computational Power," http://arxiv.org/abs/1210.5477v2, 12 pages (Nov. 27, 2012).
Hastings et al., "On Metaplectic Modular Categories and their Applications," http://arxiv.org/abs/1303.1202v2, 27 pages (Mar. 3, 2014).
International Preliminary Report on Patentability from International Application No. PCT/US2016/025451, dated Jul. 12, 2017, 8 pages.
International Search Report and Written Opinion from International Application No. PCT/US2016/025451, dated Jul. 5, 2016, 12 pages.
Kliuchnikov, "Synthesis of Unitaries with Clifford+T Circuits," http://arxiv.org/abs/1306.3200v1, (Jun. 13, 2013).
Oxman et al., "Non Abelian Structures and the Geometric Phase of Entangled Qudits," http://arxiv.org/abs/1406.4209v1, 22 pages (Jun. 17, 2014).
Vitanov, "Synthesis of arbitrary SU(3) transformations of atomic quitrits," *Physical Review A*, 85:032331-1-032331-9 (Mar. 27, 2012).
Welch et al., "Efficient approximation of diagonal unitaries over the Clifford+T basis," http://arxiv.org/abs/1412.5608v2, 15 pages (Dec. 22, 2014).
Written Opinion of the International Preliminary Examining Authority from International Application No. PCT/US2016/025451, dated Dec. 19, 2016, 6 pages.
Kliuchnikov, "New methods for Quantum Compiling," Thesis presented to the University of Waterloo in fulfillment of the thesis requirement for the degree of Doctor of Philosophy in Computer Science—Quantum Information, 144 pages (Apr. 30, 2014).
Urias, "Householder factorizations of unitary matrices," retrieved from: https://www.ifiscica.uaslp.mx/~jurias/coastal/factorU.pdf, 15 pages (2010).

* cited by examiner $$R_{|20\rangle} = (-1)(I \otimes R_{|0\rangle})SUM(I \otimes R_{|1\rangle})SUM(R_{|2\rangle} \otimes R_{|2\rangle})SUM$$

$$R_{|20\bar{2}\rangle} = (I \otimes R_{|0\bar{2}\rangle})SUM_{12}(I \otimes I \otimes R_{|\bar{2}\rangle})(I \otimes R_{|1\bar{2}\rangle})SUM_{12}SWAP_{12}(I \otimes R_{|2\bar{2}\rangle})SWAP_{12}(I \otimes R_{|2\bar{2}\rangle})SUM_{12}$$

EFFICIENT TOPOLOGICAL COMPILATION FOR METAPLECTIC ANYON MODEL

CROSS REFERENCE TO RELATED APPLICATIONS

This is the U.S. National Stage of International Application No. PCT/US2016/025451, filed Apr. 1, 2016, which was published in English under PCT Article 21(2), which in turn claims the benefit of U.S. Provisional Application No. 62/141,771, filed Apr. 1, 2015. The provisional application is incorporated herein by reference in its entirety.

FIELD

The disclosure pertains to the synthesis of quantum circuits.

BACKGROUND

Quantum computation provides an alternative approach that may permit solutions to problems that are computationally difficult (or impossible) using classical approaches. Quantum computation has unique requirements, and quantum circuit designs for a particular computation can be difficult to determine. In addition, it is generally convenient to implement quantum circuits using a basis gate set. Such basis gate sets are generally referred to as "universal," i.e., it can be shown that any circuit can be implemented using one or more elements of the gate set. In some cases, one or more additional gates are provided to simplify circuit design and implementation. Although a gate set may be known to be universal, it is often unclear how to realize a particular circuit, or, even if circuit synthesis methods are known, to provide a compact circuit specification using practical classical computational resources.

One powerful topologically protected quantum gate basis is related to a species of quasiparticles called metaplectic anyons. This gate set is referred to as a metaplectic basis. Effective synthesis of optimal circuits in this basis is an important engineering problem. Accordingly, methods and apparatus are needed for quantum circuit design using this basis.

SUMMARY

Computer-implemented methods permit efficient and effective synthesis of quantum circuits over a metaplectic basis. In some cases, qutrit states are estimated based on coefficients that are Eisenstein integers, and, depending on a required precision, circuit synthesis methods with ancillas or without ancillas are selected. A selected unitary is synthesized to include a series of one or more SUM, SWAP, Flip, Hadamard, Q, and axial reflection gates, wherein the SUM gate is defined as SUM$|j, k\rangle = |j,(j+k) \mod 3\rangle$ and is described by the following matrix:

$$SUM = \begin{pmatrix} 1 & 0 & 0 & 0 & 0 & 0 & 0 & 0 & 0 \\ 0 & 1 & 0 & 0 & 0 & 0 & 0 & 0 & 0 \\ 0 & 0 & 1 & 0 & 0 & 0 & 0 & 0 & 0 \\ 0 & 0 & 0 & 0 & 0 & 1 & 0 & 0 & 0 \\ 0 & 0 & 0 & 1 & 0 & 0 & 0 & 0 & 0 \\ 0 & 0 & 0 & 0 & 1 & 0 & 0 & 0 & 0 \\ 0 & 0 & 0 & 0 & 0 & 0 & 0 & 1 & 0 \\ 0 & 0 & 0 & 0 & 0 & 0 & 0 & 0 & 1 \\ 0 & 0 & 0 & 0 & 0 & 0 & 1 & 0 & 0 \end{pmatrix}$$

The SWAP gate is defined as SWAP$|j, k\rangle = |k, j\rangle$, the Flip gate is defined as Flip$=|0\rangle\langle 0|+|1\rangle\langle 2|-|2\rangle\langle 2|$, and the Q gate is one of:

$$Q_0 = \begin{pmatrix} \omega & 0 & 0 \\ 0 & 1 & 0 \\ 0 & 0 & 1 \end{pmatrix}, Q_1 = \begin{pmatrix} 1 & 0 & 0 \\ 0 & \omega & 0 \\ 0 & 0 & 1 \end{pmatrix}, Q_2 = \begin{pmatrix} 1 & 0 & 0 \\ 0 & 1 & 0 \\ 0 & 0 & \omega \end{pmatrix}.$$

The foregoing and other objects, features, and advantages will become more apparent from the following detailed description, which proceeds with reference to the accompanying figures.

DETAILED DESCRIPTION

Figure 1:
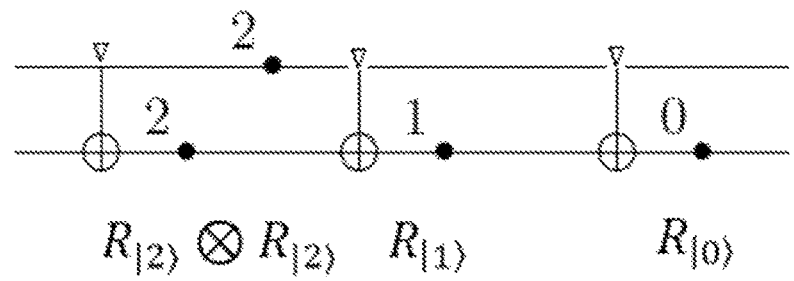
FIG. 1 illustrates a two-qutrit circuit implementing the axial reflection operator $R_{|20\rangle}$.

Disclosed herein are synthesis methods for multi-qutrit quantum circuits. In typical examples, for an arbitrary unitary, the syntheses provide circuits that are asymptotically optimal based on selected bit precisions.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and nonobvious features and aspects of the various disclosed embodiments, alone and in various combinations and subcombinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections.

INTRODUCTION

Circuit synthesis methods for arbitrary multi-qutrit unitaries over the basis $\mathbb{M}$ are disclosed. In one method, ancillas are not used, and a target n qutrit unitary is approximated as a series of local gates, SUM and SWAP gates, and $O(3^{2n})$ instances of axial reflection gates. Each of the reflection gates can be represented exactly over the basis $\mathbb{B}$ at the cost of $O((2+\sqrt{3}))^n$ single-qutrit axial reflections. In another example, n ancillary qutrits are used to approximate a unitary on n primary qutrits. Entanglement operations are approximate, and circuits include one or more two-qutrit entanglers. As used herein, for a target unitary U and an arbitrary small target precision $\varepsilon > 0$, a circuit approximating U is considered efficient if the number of primitive gates in the circuit is asymptotically proportional to $\log(1/\varepsilon)$. A circuit synthesis method is effective if it can be completed on a classical computer in expected run time that is polynomial in $\log(1/\varepsilon)$. In some examples, circuits are synthesized without ancillas, especially for n-qutrit circuits, wherein n<5. For larger n, typically n>6, ancillas can be used to lower the cost.

Equivalent Basis $\mathbb{B}$

Define $\omega = e^{2\pi i/3}$. The field of Eisenstein rationals $\mathbb{Q}(\omega)$ is a quadratic extension of $\mathbb{Q}$ and $\mathbb{Z}[\omega]$ is the corresponding integer ring that includes the group of units isomorphic to $\mathbb{Z}_6$ generated by $-\omega^2 = 1 + \omega$.

The following basic operations are associated with metaplectic anyons and are expressed with matrices over the field of Eisenstein rationals. Let $|0\rangle, |1\rangle, |2\rangle$ be the computational basis of a standard qutrit. A modified Hadamard gate H is defined as $$H|j\rangle = 1/\sqrt{-3} \sum_{k=0}^{2} \omega^{jk}|k\rangle$$

and is thus described by the matrix:

$$\frac{1}{\sqrt{-3}}\begin{pmatrix} 1 & 1 & 1 \\ 1 & \omega & \omega^2 \\ 1 & \omega^2 & \omega \end{pmatrix}$$

The increment gate INC is defined as $INC|j\rangle = |j+1 \mod 3\rangle$.

Operators $Q_j$, j=0, 1, 2 are represented as:

$$Q_0 = \begin{pmatrix} \omega & 0 & 0 \\ 0 & 1 & 0 \\ 0 & 0 & 1 \end{pmatrix}, Q_1 = \begin{pmatrix} 1 & 0 & 0 \\ 0 & \omega & 0 \\ 0 & 0 & 1 \end{pmatrix}, Q_2 = \begin{pmatrix} 1 & 0 & 0 \\ 0 & 1 & 0 \\ 0 & 0 & \omega \end{pmatrix}.$$

It can be readily shown that $Q_1 = INC Q_0 INC^\dagger$ and $Q_2 = INC^\dagger Q_0 INC$.

The two-qutrit gate defined below is a generalization of the CNOT entangler $SUM|j, k\rangle = |j, (j+k) \mod 3\rangle$ and is described by the following matrix:

$$SUM = \begin{pmatrix} 1 & 0 & 0 & 0 & 0 & 0 & 0 & 0 & 0 \\ 0 & 1 & 0 & 0 & 0 & 0 & 0 & 0 & 0 \\ 0 & 0 & 1 & 0 & 0 & 0 & 0 & 0 & 0 \\ 0 & 0 & 0 & 0 & 0 & 1 & 0 & 0 & 0 \\ 0 & 0 & 0 & 1 & 0 & 0 & 0 & 0 & 0 \\ 0 & 0 & 0 & 0 & 1 & 0 & 0 & 0 & 0 \\ 0 & 0 & 0 & 0 & 0 & 0 & 0 & 1 & 0 \\ 0 & 0 & 0 & 0 & 0 & 0 & 0 & 0 & 1 \\ 0 & 0 & 0 & 0 & 0 & 0 & 1 & 0 & 0 \end{pmatrix}$$

This gate can be considered a weakly controlled increment gate.

The SWAP gate is defined as $SWAP|j, k\rangle = |k, j\rangle$

The Flip gate is defined as $Flip = |0\rangle\langle 0| + |1\rangle\langle 2| 1| - |2\rangle\langle 2|$. The Flip gate is an elementary axial reflection operator with respect to the basis vector $|2\rangle$ and is referred to also as $R_{|2\rangle}$. Of course, there are additional Flip gates with respect to the other basis vectors.

As shown in Cui and Wang, "Universal Quantum Computation with Metaplectic Anyons," arXiv:1404.7778v2 (16 Jul. 2014), the H, SUM, $Q_0$, INC, SWAP gates can be implemented by anyon braiding alone and generate a finite subgroup of $SU(3^n)$ that coincides with the Clifford subgroup. Adding the Flip gate to this basis makes the basis universal for multi-qutrit quantum computation. Such a basis is referred to herein as an augmented metaplectic basis. For both efficiency and convenience a broader equivalent basis $\mathbb{B}$ can be used that also contains the $P_2$ gate $P_2 = Flip Q_2^2$ and one or more of its classical adjoints $P_0 = INC P_2 INC^\dagger, P_1 = INC^\dagger P_2 INC$. This basis can be referred to as an extended metaplectic basis. In estimating circuit cost, the Flip gate is assumed to be the most costly and the costs of the remaining gates are assumed to be significantly lower. Therefore, R-count can be used as the measure of quantum circuit cost in the basis $\mathbb{B}$.

The R-count of a unitary circuit over the quantum basis $\mathbb{B}$ is the minimal number of occurrences of the Flip gate in the circuit. Note that $P_j^6 = I$ and therefore there are exactly 15 distinct non-identity gates of the form $P_j^d$, d=0, ..., 5. A $P_j^d$ gate requires a single Flip gate if and only if d is odd. Thus there are nine gates $P_j^d$, d=1, 3, 5 each with R-count of 1.

In the analysis and synthesis below it is also beneficial to track the H-count of a circuit, defined as the number of occurrences of the Hadamard gate in the circuit.

As used herein, the basis $\mathbb{B}$ can be a minimal basis that includes a single Q gate, or an extended basis that includes some or all of the Q-gates, the P-gates, and the Flip gate.

Exact Representation of Single Qutrit Unitaries in $\mathbb{B}$

If $|\psi\rangle$ is a unitary state the coefficients of which in a computational basis are Eisenstein integers, then 1) one and only one coefficient is non-zero; 2) the non-zero coefficient is an Eisenstein integer unit; and $|\psi\rangle$ can be reduced to one of the computational basis states using at most one P gate. This can be shown as follows.

If $\psi_0, \ldots, \psi_N$ are the coefficients, then $$\sum_{j=0}^{N} |\psi_j|^2 = 1.$$

Since for any j, $|\psi_j|^2$ is a non-negative integer, all the coefficients, except one, some $\psi_{j*}$, must be zeros, while $|\psi_{j*}|^2 = 1$ and hence $\psi_j$ is a unit in $\mathbb{Z}[\omega]$. Therefore $\psi_{j*} = (-\omega^2)^d$ and $(-\omega^2)^{-d \bmod 6} \psi_{j*} = 1$. Hence it is easy to find a P-gate of the form $G = I \otimes \ldots P_j^{-d \bmod 6} \ldots \otimes I$ such that $G|\psi\rangle$ is a standard basis vector.

Single-qutrit synthesis case can be based on an Eisenstein state reduction procedure as follows. Let $|\psi\rangle$ be a unitary single-qutrit state of the form $|\psi\rangle = 1/\sqrt{-3}^L(u|0\rangle + v|1\rangle + w|2\rangle)$ where u, v, w∈$\mathbb{Z}[\omega]$, L∈$\mathbb{Z}$. There exists an effectively computable circuit c over the basis $\mathbb{B}$ of R-count at most 2L+1 and H-count at most L such that $c|\psi\rangle$ is a standard basis vector. A representative procedure for determining such a circuit is illustrated in the pseudo code of Table 1.

TABLE 1

Procedure for finding circuit that maps $|\psi\rangle$ to a standard basis vector.

Require: L ∈ $\mathbb{Z}$, u,v,w ∈ $\mathbb{Z}[\omega]$
1:  ret ← ⟨empty⟩
2:  while L > 0 do
3:      {vu,vu,vw} = {|u|², |v|², |w|²} mod 3
4:      if vu = vu = vw = 1 then
5:          Find $d_v, d_w$ ∈ {-2,-1,0,1,2,3} such that
6:              u ≡ $(-w^2)^{d_v}$ v ≡ $(-w^2)^{d_w}$ w mod 3
7:              {u,v,w} ← {u, $(-w^2)^{d_v}$ v, $(-w^2)^{d_w}$ w}
8:              {u,v,w} ←
9:              {u + v + w, u + wv + w² w, u + w² v + ww}
10:             ret ← H $P_1^{d_v} P_2^{d_w}$ ret
11:         end if
12:         {u,v,w} ← {u,v,w}/(1 + 2w)
13:         L ← L - 1
14: end while
15: Implied L = 0; Only one of u,v,w is non-zero,
16: Find classical g s. t. g(u|0⟩ + v|1⟩ + w|2⟩) = u'|0⟩
17: Find d ∈ {2, -1, 0, 1, 2, 3} such that $(-w^2)^d$ = u'
18: return $P_0^{-d}$ g ret

Approximation of Single Qutrit States

It is shown below that any unitary state of the form $|\psi\rangle = x|0\rangle + y|1\rangle$, x,y∈$\mathbb{C}$, $|x|^2 + |y|^2 = 1$ can be approximated to a precision ε, wherein ε is a small positive number, by a unitary state of the form $(u|0\rangle + v|1\rangle + w|2\rangle)/\sqrt{-3}^k$, u, v, w ∈ $\mathbb{Z}[\omega]$, k∈$\mathbb{Z}$, such that k≤4 $\log_3(1/\varepsilon) + O(\log(\log(1/\varepsilon)))$. The expected classical runtime required to do the approximation effectively is polynomial in $\log(1/\varepsilon)$.

For a given complex number z with $|z|≤1$ and small enough ε>0 there exists an integer k≤2 $\log_3(1/\varepsilon)+3$ and an Eisenstein integer u∈$\mathbb{Z}[\omega]$ such that $|u/\sqrt{-3}^k - z| < \varepsilon$ and $|u/\sqrt{-3}^k| ≤ |z|$. Set $$k_0 = \lfloor 2\log_3\left(\frac{1}{\varepsilon}\right) + 3 \rfloor$$

and let l be a non-negative integer that can be arbitrarily large. For k=$k_0$+l there are Ω($3^l$) distinct choices of Eisenstein integer u such that $|u/\sqrt{-3}^k - z| < \varepsilon$.

A procedure for approximating a state in this way is shown in Table 2. Typically, this procedure involves solution of a norm equation (see step 10).

TABLE 2

Representative procedure for approximating a single qutrit state.

Require: x,y ∈ $\mathbb{C}$; $|x|^2 + |y|^2 = 1$; ε > 0
1:  δ ← $\varepsilon^2/5$
2:  $k_0$ ← $\lfloor 4 \log_2(1/\varepsilon) + \log_3(\sqrt{2}) + 3 \rfloor$
3:  w ← None; k ← $k_0$ - 1
4:  while w = None do
5:      k ← k + 1
6:      enum ← enumerator for all u,v ∈ $\mathbb{Z}[w]$
7:      s.t. (u|0⟩ + v|1⟩)/$\sqrt{-3}^k$ is δ-close to x|0⟩ + y|1⟩
8:      while w = None ∧ enum.Next do
9:          (u,v) ← enum.Current
10:         If Equation $|z|^2 = 3^k - |u|^2 - |v|^2$ is easily solvable
            for z then
11:             w ← z
12:         end if
13:     end while
14: end while
15: return {u,v,w,k}

Cost of Selected Single Qutrit States

Certain unitaries can be conveniently represented in the basis $\mathbb{B}$ with limited P-count and H-count. Let $|\psi\rangle$ be a unitary single-qutrit state of the form $|\psi\rangle = 1/\sqrt{-3}^L(u|0\rangle + v|1\rangle + w|2\rangle)$, wherein u,v,w∈$\mathbb{Z}[\omega]$, L∈$\mathbb{Z}$. It can be shown that there exists an effectively computable circuit c over the basis $\mathbb{B}$ of R-count at most 2L+1 and H-count at most L such that $c|\psi\rangle$ is a standard basis vector. Of course, it can also be shown that a standard basis vector can be mapped to a unitary single-qutrit state using the circuit $c^\dagger$.

Implementations of Axial Reflection Operators

Let $|b\rangle$ be a standard n-qutrit basis state. Then an axial reflection operator $R_{|b\rangle}$ is defined as $R_{|b\rangle} = I^{\otimes n} - 2|b\rangle\langle b|$. Clearly, $R_{|b\rangle}$ is represented by a diagonal matrix that has a -1 on the diagonal in the position corresponding to $|b\rangle$ and +1 in all other positions. In particular in the trivial case of n=1, the basic Flip gate is the same as $R_{|2\rangle}$. Also $R_{|0\rangle}$=INCFlipINC² and $R_{|1\rangle}$=INC²FlipINC. In general, any two axial reflection operators are equivalent by conjugation with an effectively and exactly representable classical permutation. Since the cost of classical permutations is considered as negligible compared to the cost of Flip gate, for fixed n all n-qutrit axial reflection operators have essentially the same cost. In particular, the R-count of each of the single-qutrit operators $R_{|0\rangle}$, $R_{|1\rangle}$, $R_{|2\rangle}$ is 1.

All n-qutrit axial reflection operators can be effectively and exactly represented. It suffices to represent just one such operator for each n. Starting with the special case of n=2, the circuit $(I \otimes R_{|0\rangle})\text{SUM}(I[R_{|1\rangle})\text{SUM}(R_{|2\rangle} \otimes R_{|2\rangle})\text{SUM}$ is an exact representation of $(-1)R_{|20\rangle}$.

This result can be generalized for arbitrary n≥2 and note that the global phase (-1) is exceptional and happens only for n=2. Denote $\overline{2}$ to represent a string of n-2 occurrences of 2. Then the circuit $$C_{|0\bar{2}\rangle} = (I \otimes R_{|02\rangle})\text{SUM}_{1,2}(I \otimes I \otimes R_{|2\rangle})(I \otimes R_{|12\rangle})$$

$$\text{SUM}_{1,2}\text{SWAP}_{1,2}(I \otimes R_{|22\rangle})\text{SWAP}_{1,2}(I \otimes R_{|22\rangle})\text{SUM}_{1,2}$$

is an exact representation of the operator $R_{|20\bar{2}\rangle}$. As noted above, all axial reflection operators in n-qutrits have the same R-count. It can be shown that the cost of the above exact implementation of an n-qutrit axial reflection operator is exponential in n. This cost can lead to several design choices set forth below. In particular, for some n, an approximate implementation may be more useful.

Approximate Synthesis of Special Two-Level, Diagonal, and Single-Qutrit Unitaries Let $|j\rangle$ and $|k\rangle$ be two distinct elements of the standard n-qutrit basis. Then a special two-level unitary with signature [n; j,k] is a unitary operator of the form $I^{\otimes n}+(u-1)|j\rangle\langle j|+v|j\rangle\langle k|-v^*|k\rangle\langle |+(u^*-1)|k\rangle\langle k|$ where $|u|^2+|v|^2=1$. In other words, the matrix of a special two-level unitary is different from the identity matrix in at most four locations and the determinant of a special two-level unitary is equal to 1. A special two-level unitary operator can be effectively represented as a product of two reflection operators, each factor being a reflection with respect to a two-level n-qutrit vector.

Let $\phi$ be a real angle and consider the vector $v_\phi=\cos(\phi/2)|0\rangle+\sin(\phi/2)|1\rangle$. By direct computation $e^{i\phi Y}=R_{|0\rangle}R_{v_\phi}$, where Y is the Pauli matrix $i(|1\rangle\langle 0|-|0\rangle\langle 1|)$. Any special unitary $U\in SU(2)$ can be effectively diagonalized to a diagonal special unitary of the form $e^{i\phi Z}$ where Z is the Pauli matrix $|0\rangle\langle 0|-|1\rangle\langle 1|$. But $e^{i\phi Z}=(\text{sh})^\dagger e^{i\phi Y}(\text{sh})$, where s is the phase gate $|0\rangle\langle 0|+i|1\rangle\langle 1|$ and h is the two-level Hadamard gate $(X+Z)/\sqrt{2}$. In summary, $U\in SU(2)$ can be represented as $Ve^{i\phi Y}V^\dagger$ with some effectively computed unitary V and the latter is equal to $R_{V|0\rangle}R_{Vv_\phi}$.

Consider a multidimensional special two-level unitary $G=I^{\otimes n}+(u-1)|j\rangle\langle j|+v|j\rangle\langle k|-v^*|k\rangle\langle j|+(u^*-1)|k\rangle\langle k|$ and let $R_{V|0\rangle}R_{Vv_\phi}$ be the decomposition of the SU(2) unitary $U=u|0\rangle\langle 0|+v|0\rangle\langle 1|-v^*|1\rangle\langle 0|+(u^*-1)|1\rangle\langle 1|$ as outlined above. By way of notation, let $V|0\rangle=x_0|0\rangle+z_0|1\rangle$ and let $Vv_\phi=x_1|0\rangle+z_1|1\rangle$. Consider two-level n-qutrit states $v_m=x_m|j\rangle+z_m|k\rangle$, m=0,1. Clearly, $G=R_{v_0}R_{v_1}$.

Let $\varepsilon>0$ be small enough precision level, then a special two-level unitary operator is effectively approximated to precision $\varepsilon>0$ by a circuit over $\mathbb{B}$ containing two axial reflection operators and local gates with cumulative R-count at most $32 \log_3(1/\varepsilon)+O(\log(\log(1/\varepsilon)))$.

As per the above, the subject operator is effectively represented as $R_{v_0}R_{v_1}$ where $v_0$, $v_1$ are two-level states. Each $v_m$, m=0, 1 can be approximated to precision $\varepsilon/(4\sqrt{2})$ by $c_m|0\rangle$ where $c_m$ is effectively synthesized circuit over $\mathbb{B}$ of R-count at most $8 \log_3 (1/\varepsilon)+O(\log(\log(1/\varepsilon)))$.

It is known that the reflection $R_{v_m}$ can be approximated to $\varepsilon/2$ by $c_m^\dagger R_{|0\rangle}c_m$ which is a circuit with one axial reflection and R-count at most $16 \log_3(1/\varepsilon)+O(\log(\log(1/\varepsilon)))$. Therefore the subject operator is approximated to precision $\varepsilon$ by $c_0^\dagger R_{|0\rangle}c_0c_1^\dagger R_{|0\rangle}c_1$ that contains two axial reflections and has R-count at most $32 \log_3(1/\varepsilon)+O(\log(\log(1/\varepsilon)))$ In general, there are no cancellations in the $c_0c_1^\dagger$ that would reduce the R-count.

In the following, let N stand for $3^n$ in subsequent n-qutrit contexts.

Diagonal unitaries can be approximated as follows. Let D be an arbitrary n-qutrit diagonal unitary in general position and let $\varepsilon>0$ be a small enough precision level. D can be effectively approximated, up to a global phase, to precision $\varepsilon$ by a circuit over $\mathbb{B}$ containing 2(N–1) axial reflection operators and local gates with cumulative R-count at most $32(N-1)(\log_3(1/\varepsilon)+n+O(\log(\log(1/\varepsilon))))$. Removing a global phase, $D'=\text{diag}(e^{i\theta_0}, e^{i\theta_1}, \ldots, e^{i\theta_{N-1}})$ where $\theta_j \in \mathbb{R}$, j=1, ... N–1 and $$\sum_{j=0}^{N-1} \theta_j = 0.$$

D' can be easily decomposed into a product of N–1 special two-level diagonal unitaries:

$$D' = \prod_{j=1}^{N-1} D_j,$$

$$D_j = I^{\otimes n} + (e^{i\Theta_j} - 1)|j-1\rangle\langle j-1| + (e^{-i\Theta_j} - 1)|j\rangle\langle j|,$$

$$\text{wherein } \Theta_j = \sum_{k=0}^{j-1} \theta_k.$$

It suffices to approximate each special unitary $D_j$ to precision $\varepsilon/(N-1)$ as shown above and tally the gate counts. Pseudo code for this method of implementing a diagonal unitary is shown in Table 3 below.

TABLE 3

Approximation of a diagonal unitary

Require: diag($e^{i\theta_0}$, $e^{i\theta_1}$, ..., $e^{i\theta_{N-1}}$)
1: ret ← empty 2: $\bar{\theta} \leftarrow \frac{1}{N}\sum_{j=0}^{N-1} \theta_j$ 3: for j = 1..N – 1 do
4:     $\Theta \leftarrow \Sigma_{k=0}^{j-1}(\theta_k - \bar{\theta})$
5:     $D_j \leftarrow I^{\otimes n} + (e^{i\Theta} - 1)|j-1\rangle\langle j-1| + (e^{-i\Theta} - 1)|j\rangle\langle j|$
6:     $\{R_{j,1}, R_{j,2}\} \leftarrow$ two-reflection-decomposition($D_j$)
7:     ret ← ret $R_{j,1}, R_{j,2}$
8: end for
9: return ret An ancilla-free implementation of an n-qutrit axial reflection is exact but produces a circuit with R-count that is exponential in n. This might be practically challenging for larger values of n when coarser values of the desired precision $\varepsilon$ are sufficient. An alternative, ancilla-assisted solution is provided below. In addition, application of the above synthesis in case of n=1 leads to a somewhat suboptimal circuit. A better solution for single-qutrit case is possible. Any $U \in U(3)$ is effectively approximated, up to a global phase to precision $\varepsilon$ by a circuit over $\mathbb{B}$ with R-count in $96 \log_3 (1/\varepsilon)+O(\log(\log(1/\varepsilon)))$. Removing $\det(U)^{1/3}$ as a global phase if needed, $U=\det(U)^{1/3}U'$ wherein $U'\in SU(3)$. It is well known that U' can be effectively decomposed into three special two-level unitaries. Each of the two-level unitaries can be effectively approximated by a circuit with two single-qutrit reflections and a collection of gates with cumulative R-count in $32 \log_3(1/\varepsilon)+O(\log(\log(1/\varepsilon)))$. Note that the single-qutrit reflections each have an R-count of one and this incremental count can be absorbed into the O(log (log(1/ε))) term.

Multi-Controlled Single-Qutrit Unitaries

Define the gate $C^1(INC)|j,k\rangle = |j, (k+\delta_{j,2}) \mod 3\rangle$. A controlled phase single-qutrit unitary based on reflection operators can be obtained based on the following observations. (1) a diagonal unitary with only one non-zero phase, $C^n(e^{i\theta})$, $\theta \in \mathbb{R}$, $\theta \neq 0$ can be effectively emulated approximately to precision ε by an ancilla-assisted (n+1)-qutrit circuit with R-count of at most $32 \log_3(1/\varepsilon) + O(\log(\log(1/\varepsilon)))$ plus the cost of two (n+1)-qutrit axial reflections; and (2) a strictly controlled single-qutrit phase factor $C^n(e^{i\theta}I)$ can be effectively emulated approximately to precision ε by an ancilla-assisted (n+2)-qutrit circuit with R-count of at most $32 \log_3(1/\varepsilon) + O(\log(\log(1/\varepsilon)))$ plus the cost of two (n+1)-qutrit axial reflections.

Regarding (1), add an (n+1)st-qutrit as an ancilla prepared at state $|0\rangle$ and consider the following (n+1)-qutrit diagonal unitary $U = C^n(\text{diag}(e^{i\theta}, e^{-i\theta}, 1))$. Clearly U emulates $C^n(e^{i\theta})$ and it is also a special two-level unitary. As shown above, U can be effectively approximated by a circuit with R-count of at most $32 \log_3(1/\varepsilon) + O(\log(\log(1/\varepsilon)))$ plus the cost of two (n+1)-qutrit axial reflections. (2) Follows from (1) and $C^n(e^{i\theta}I) = C^n(e^{i\theta}) \otimes I$.

A controlled single-qutrit unitary based on reflection operators can be obtained based on the following observations. (1) Given a $V \in SU(3)$, an integer n>0 and a small enough ε>0, $C^n(V)$ can be effectively approximated to precision ε by an (n+1)-qutrit circuit with an R-count of at most $96 \log_3(1/\varepsilon) + O(\log(\log(1/\varepsilon)))$ plus the cost of six (n+1)-qutrit axial reflections. (2) Given a $V \in SU(3)$, an integer n>0 and a small enough ε>0, $C^n(V)$ can be effectively approximated to precision ε by an ancilla-assisted (n+2)-qutrit circuit with R-count of at most $128 \log_3(1/\varepsilon) + O(\log(\log(1/\varepsilon)))$ plus the cost of eight (n+1)-qutrit axial reflections.

A $V \in U(3)$ can be effectively represented as a product of a global phase and three two-level special unitaries: $V = e^{i\theta}V_1V_2V_3$. $\theta = 0$ if $V \in SU(3)$. Each of the $C^n(V_j)$, j=1, 2, 3 is a special two-level unitary which can be effectively approximated to ε/4 by a circuit with R-count of at most $32 \log_3(1/\varepsilon) + O(\log(\log(1/\varepsilon)))$ plus the cost of two (n+1)-qutrit axial reflections. If $\theta \neq 0$ the $C^n(e^{i\theta})$ factor is considered, leading to (2).

Part of the implementation cost of $C^n(V)$ is due to the cost of the axial reflections in $O((2+\sqrt{5})^n)$ absent some improvement. This can be a practical challenge when n is large and ε is coarse. Some more practical alternatives are described below.

Multi-Controlled Single-Qutrit Unitaries and Ancilla Assisted Circuits

Absent an exact representation, $C^1(INC)$ is approximated to a desired precision. One solution is based on decomposing $C^1(INC)$ into two special two-level unitaries, but a better approximation to precision ε can be obtained with a purely unitary circuit over $\mathbb{B}$ that contains at most $32 \log_3(1/\varepsilon) + O(\log(\log(1/\varepsilon)))$ occurrences of local Flip gates, at most $16 \log_3(1/\varepsilon) + O(\log(\log(1/\varepsilon)))$ occurrences of the H-gate and two two-qutrit axial reflections.

$C^1(INC)$ is a composition of two reflection operators: $CINC = R_{|2\rangle \otimes v_2} R_{|2\rangle \otimes v_0}$, wherein $v_0 = (|1\rangle - |2\rangle)/\sqrt{2}$, $v_2 = (|0\rangle - |1\rangle)/\sqrt{2}$. As shown above, each of the states $v_j$ is effectively approximated to precision ε/2 as $c_j|0\rangle$ where $c_j$ is a single-qutrit unitary circuit over $\mathbb{B}$ with at most $8 \log_3(1/\varepsilon) + O(\log(\log(1/\varepsilon)))$ occurrences of P-gates and at most $4 \log_3(1/\varepsilon) + O(\log(\log(1/\varepsilon)))$ occurrences of the H-gate. Therefore $C^1(INC) \sim (I \otimes c_2) R_{|20\rangle} (I \otimes c_2^\dagger)(I \otimes c_0^\dagger)$ to precision ε.

$R_{|20\rangle}$ is a simple classical adjoint of the CFlip gate and can be implemented by a unitary ancilla-free circuit containing five P gates and three SUM gates.

Given $V \in U(3)$, an integer n>0 and a small enough ε>0, $C^n(V)$ can be effectively emulated approximately to precision ε by an ancilla-assisted 2n-qutrit circuit with R-count of at most $128n(\log_3(1/\varepsilon) + O(\log(\log(1/\varepsilon))))$.

Ancilla assisted synthesis tend to be more appropriate for larger n and smaller values of ε as shown in Table 4 below.

TABLE 4

| Selection of ancilla assisted circuits | |
| --- | --- |
| Qutrits | Ancilla-assisted favored when |
| 3 | $\varepsilon < 10^{-2}$ |
| 4 | $\varepsilon < 10^{-4}$ |
| 5 | $\varepsilon < 10^{-6}$ |
| 6 | $\varepsilon < 10^{-8}$ |

General n-Qutrit Unitaries

Table 5 below illustrates a representative method of synthesis for a multi-qutrit unitary, with or without ancillas.

TABLE 5

| Multi-qutrit circuit synthesis in basis $\mathbb{B}$ |
| --- |
| Require: $U \in U(3^n)$, ε > 0, ancillaFlag |
| 1:    $U = D \Pi_{k=1}^K U_k$ {Diagonal D and two-level $U_k$} |
| 2:    if ancillaFlag then |
| 3:        ret ← ancilla assisted decomposition (D,ε) |
| 4:    else |
| 5:        ret ← decomposition(D,ε) |
| 6:    end if |
| 7:    for k = 1..K do |
| 8:        if ancillaFlag then |
| 9:            c ← decomposition($U_k$,ε) |
| 10:       else |
| 11:            c ← decomposition($U_k$,ε) |
| 12:      end if |
| 13:      ret ← ret c |
| 14:    end for |
| 15:    return ret |

Representative Circuits

Figure 2:
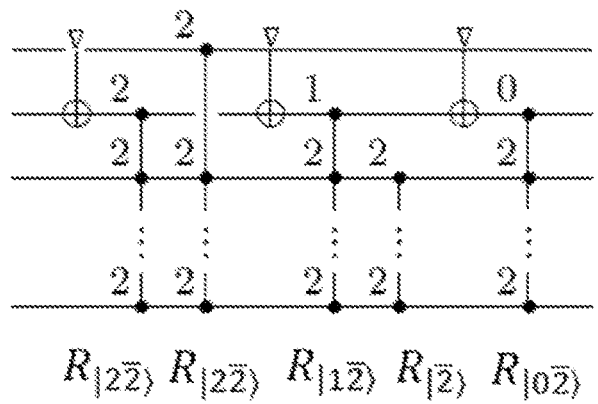
FIG. 2 illustrates a multi-qutrit circuit implementing the axial reflection operator $R_{|20\bar{2}\rangle}$.
Figure 3:
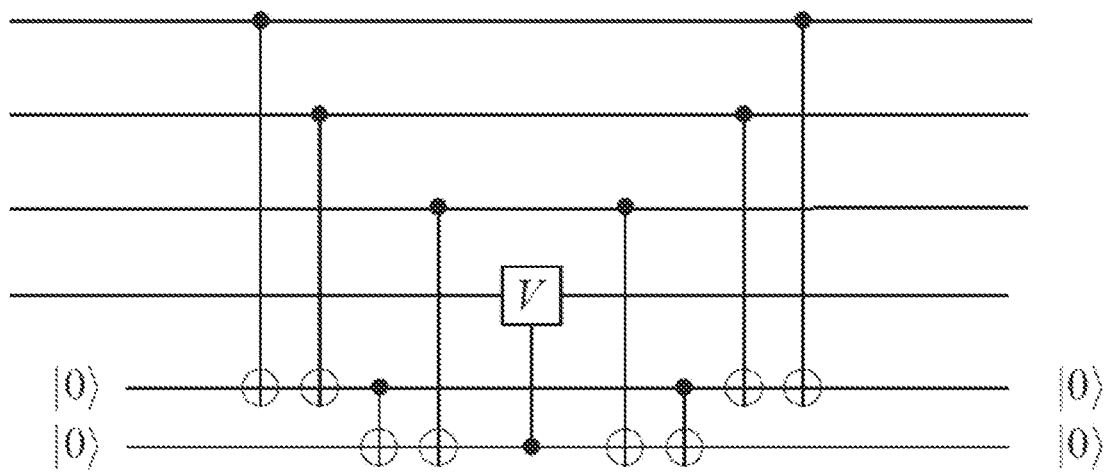
FIG. 3 illustrates a multi-qutrit circuit implementing the operator C"(V).

FIGS. 1-2 illustrate a representative 2-qutrit reflection circuit and a multi-qutrit reflection circuit, respectively. FIG. 3 illustrates a circuit implementing $C^n(V)$ using ancillas. These and similar circuits can be used in the synthesis methods discussed above.

Representative Method

Figure 4:
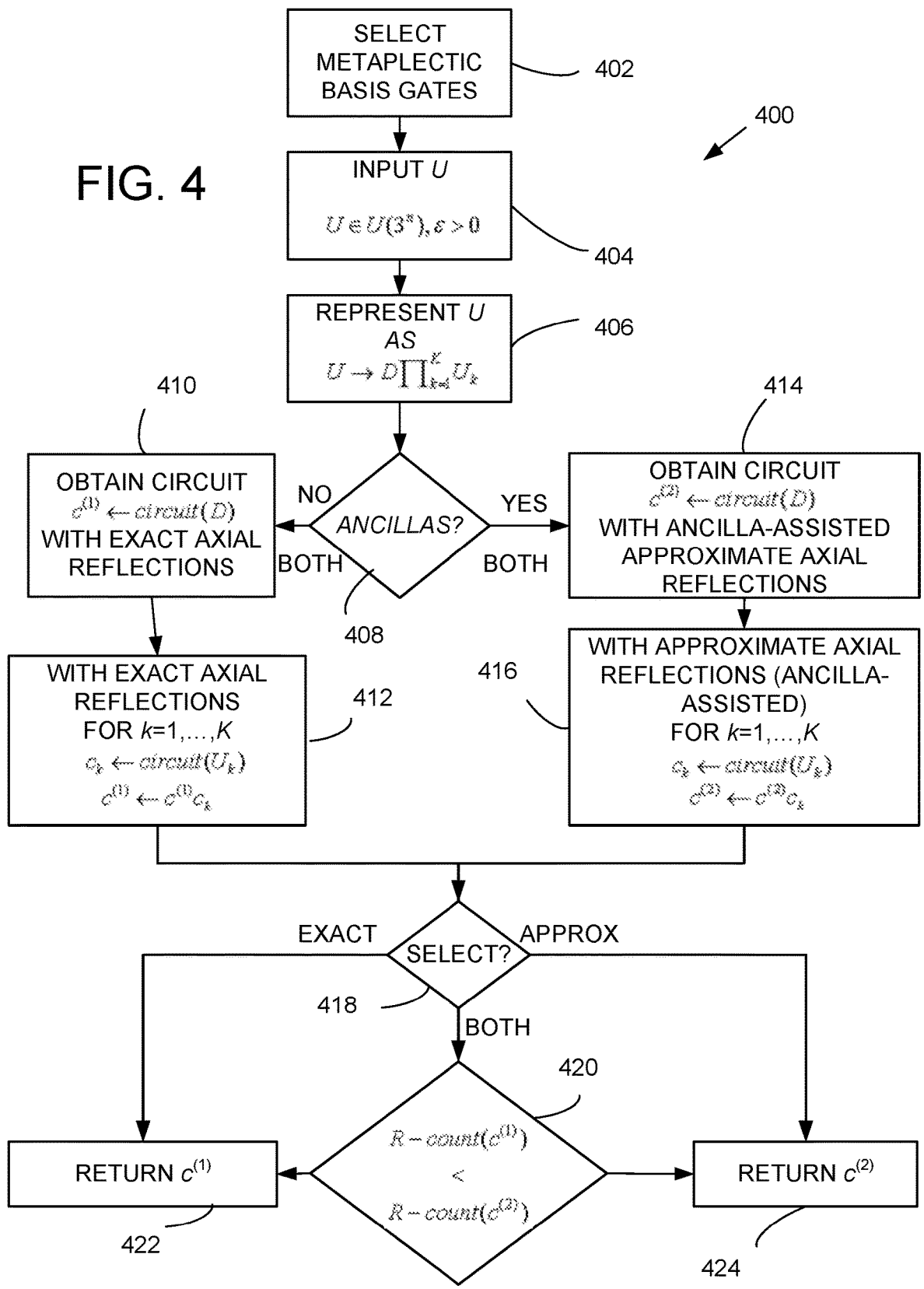
FIG. 4 illustrates a representative method of quantum circuit synthesis using a metaplectic basis to that produces circuits with or without ancillas.

Referring to FIG. 4, a representative synthesis method 400 includes selecting a basis at 402, such as the basis $\mathbb{B}$ with or without extensions such as additional P or Q gates. At 404, a circuit U is received for synthesis along with a required precision ε. At 406, the circuit U is represented as a product $U \to D\Pi_{k=1}^K U_k$. At 408, a determination is made as to whether ancillas are to be used. If ancillas are to be used, ancilla-based syntheses are used at 414, 416 using approximate axial reflections. If no ancillas are intended, ancilla-free syntheses are used at 410, 412, using exact representations of axial reflections. In some cases, both ancilla-free and ancilla based syntheses are produced. If so, the synthesis with the lower R-count is selected at 418. In any case, the selected synthesis is returned at 422, 424 as appropriate.

Classical and Quantum Computing Environment

Figure 5:
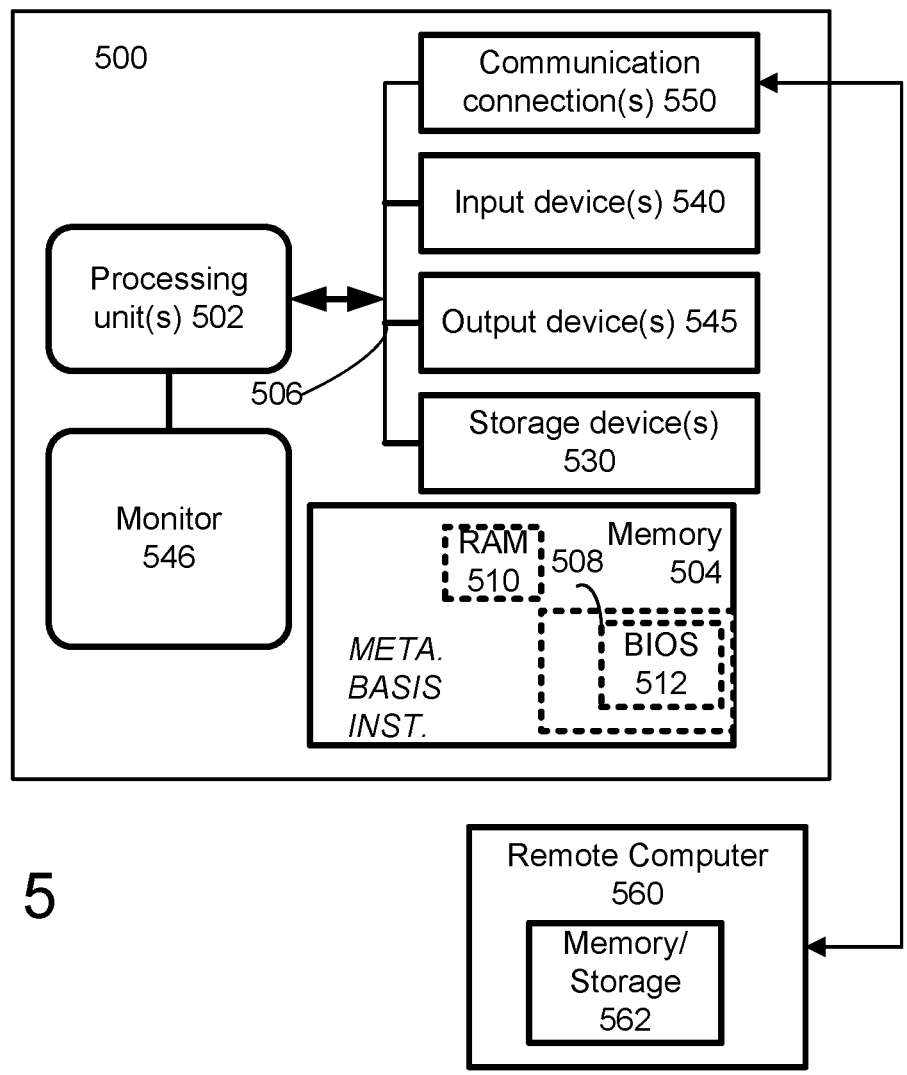
FIG. 5 illustrates a classical computing environment for performing quantum circuit synthesis using a metaplectic basis.

FIG. 5 and the following discussion are intended to provide a brief, general description of an exemplary computing environment in which the disclosed technology may be implemented. Although not required, the disclosed technology is described in the general context of computer executable instructions, such as program modules, being executed by a personal computer (PC). Generally, program modules include routines, programs, objects, components, data structures, etc., that perform particular tasks or implement particular abstract data types. Moreover, the disclosed technology may be implemented with other computer system configurations, including hand held devices, multiprocessor systems, microprocessor-based or programmable consumer electronics, network PCs, minicomputers, mainframe computers, and the like. The disclosed technology may also be practiced in distributed computing environments where tasks are performed by remote processing devices that are linked through a communications network. In a distributed computing environment, program modules may be located in both local and remote memory storage devices.

With reference to FIG. 5, an exemplary system for implementing the disclosed technology includes a general purpose computing device in the form of an exemplary conventional PC 500, including one or more processing units 502, a system memory 504, and a system bus 506 that couples various system components including the system memory 504 to the one or more processing units 502. The system bus 506 may be any of several types of bus structures including a memory bus or memory controller, a peripheral bus, and a local bus using any of a variety of bus architectures. The exemplary system memory 504 includes read only memory (ROM) 608 and random access memory (RAM) 510. A basic input/output system (BIOS) 512, containing the basic routines that help with the transfer of information between elements within the PC 500, is stored in ROM 508. As shown in FIG. 5, RAM 510 can store representations of metaplectic basis circuits, instructions for circuit synthesis in such bases, as well as computer-executable instructions for receiving, processing, and output of quantum circuits.

The exemplary PC 500 further includes one or more storage devices 530 such as a hard disk drive for reading from and writing to a hard disk, a magnetic disk drive for reading from or writing to a removable magnetic disk, and an optical disk drive for reading from or writing to a removable optical disk (such as a CD-ROM or other optical media). Such storage devices can be connected to the system bus 506 by a hard disk drive interface, a magnetic disk drive interface, and an optical drive interface, respectively. The drives and their associated computer readable media provide nonvolatile storage of computer-readable instructions, data structures, program modules, and other data for the PC 500. Other types of computer-readable media which can store data that is accessible by a PC, such as magnetic cassettes, flash memory cards, digital video disks, CDs, DVDs, RAMs, ROMs, and the like, may also be used in the exemplary operating environment.

A number of program modules may be stored in the storage devices 530 including an operating system, one or more application programs, other program modules, and program data. Storage of quantum syntheses and instructions for obtaining such syntheses can be stored in the storage devices 530. A user may enter commands and information into the PC 500 through one or more input devices 540 such as a keyboard and a pointing device such as a mouse. Other input devices may include a digital camera, microphone, joystick, game pad, satellite dish, scanner, or the like. These and other input devices are often connected to the one or more processing units 502 through a serial port interface that is coupled to the system bus 506, but may be connected by other interfaces such as a parallel port, game port, or universal serial bus (USB). A monitor 546 or other type of display device is also connected to the system bus 506 via an interface, such as a video adapter. Other peripheral output devices, such as speakers and printers (not shown), may be included. In some cases, a user interface is display so that a user can input a circuit for synthesis, and verify successful synthesis.

The PC 500 may operate in a networked environment using logical connections to one or more remote computers, such as a remote computer 560. In some examples, one or more network or communication connections 550 are included. The remote computer 560 may be another PC, a server, a router, a network PC, or a peer device or other common network node, and typically includes many or all of the elements described above relative to the PC 1500, although only a memory storage device 562 has been illustrated in FIG. 5. The personal computer 500 and/or the remote computer 560 can be connected to a logical a local area network (LAN) and a wide area network (WAN). Such networking environments are commonplace in offices, enterprise wide computer networks, intranets, and the Internet.

When used in a LAN networking environment, the PC 500 is connected to the LAN through a network interface. When used in a WAN networking environment, the PC 500 typically includes a modem or other means for establishing communications over the WAN, such as the Internet. In a networked environment, program modules depicted relative to the personal computer 500, or portions thereof, may be stored in the remote memory storage device or other locations on the LAN or WAN. The network connections shown are exemplary, and other means of establishing a communications link between the computers may be used.

Figure 6:
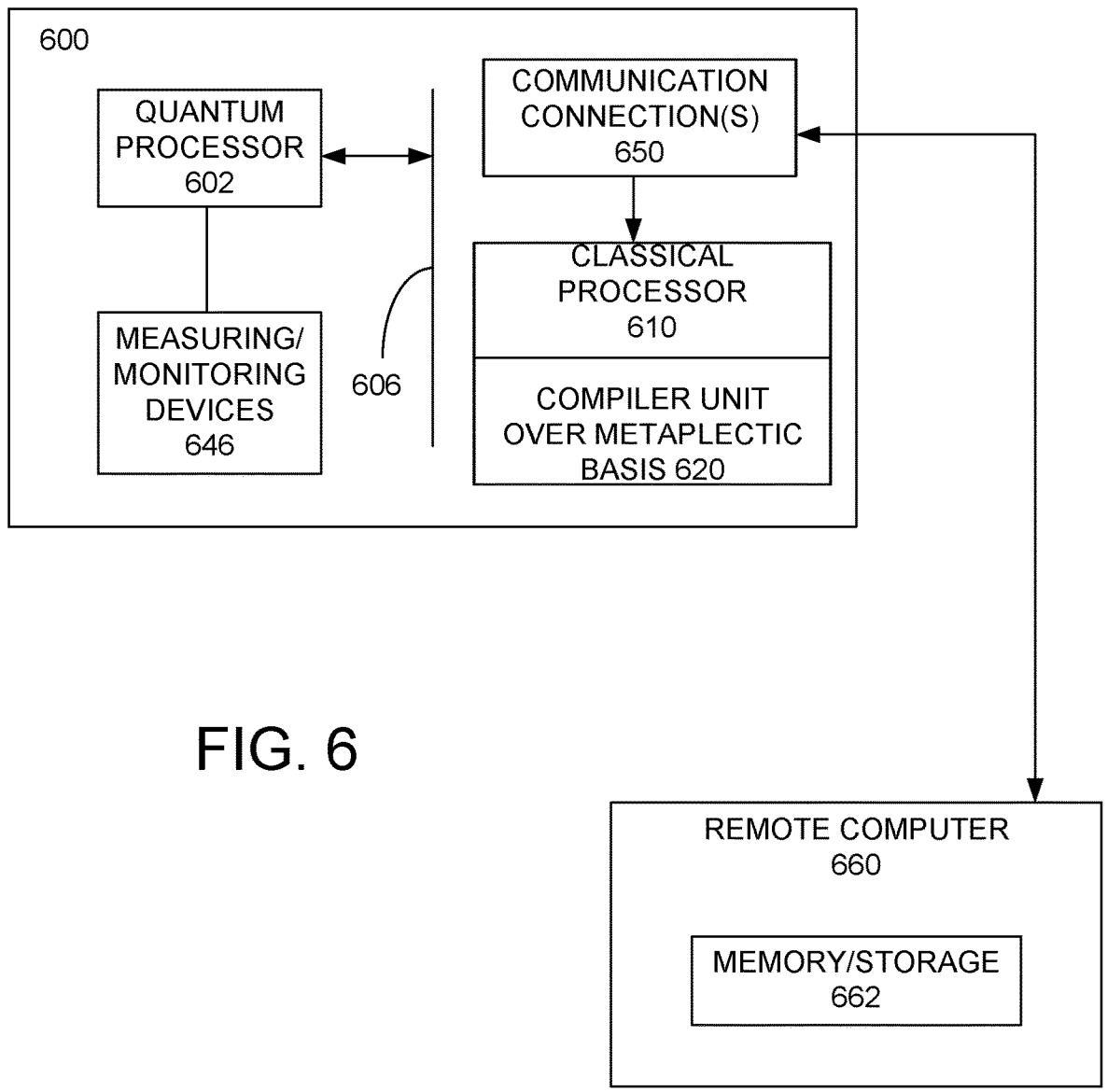
FIG. 6 illustrates a classical compiler that synthesizes circuits for a quantum computer.

With reference to FIG. 6, an exemplary system for implementing the disclosed technology includes computing environment 600, where compilation into braid pattern circuits is separated from the quantum processing that consumes the compiled circuits. The environment includes a quantum processing unit 602 and one or more monitoring/measuring device(s) 646. The quantum processor executes quantum circuits that are precompiled by classical compiler unit 620 utilizing one or more classical processor(s) 610. The precompiled quantum circuits are downloaded into the quantum processing unit via quantum bus 606. As shown in FIG. 6, compilation uses an augmented or extended metaplectic basis.

Compilation is the process of translation of a high-level description of a quantum algorithm into a sequence of quantum circuits. Such high-level description may be stored, as the case may be, on one or more external computer(s) 660 outside the computing environment 600 utilizing one or more memory and/or storage device(s) 662, then downloaded as necessary into the computing environment 600 via one or more communication connection(s) 650.

Figure 7:
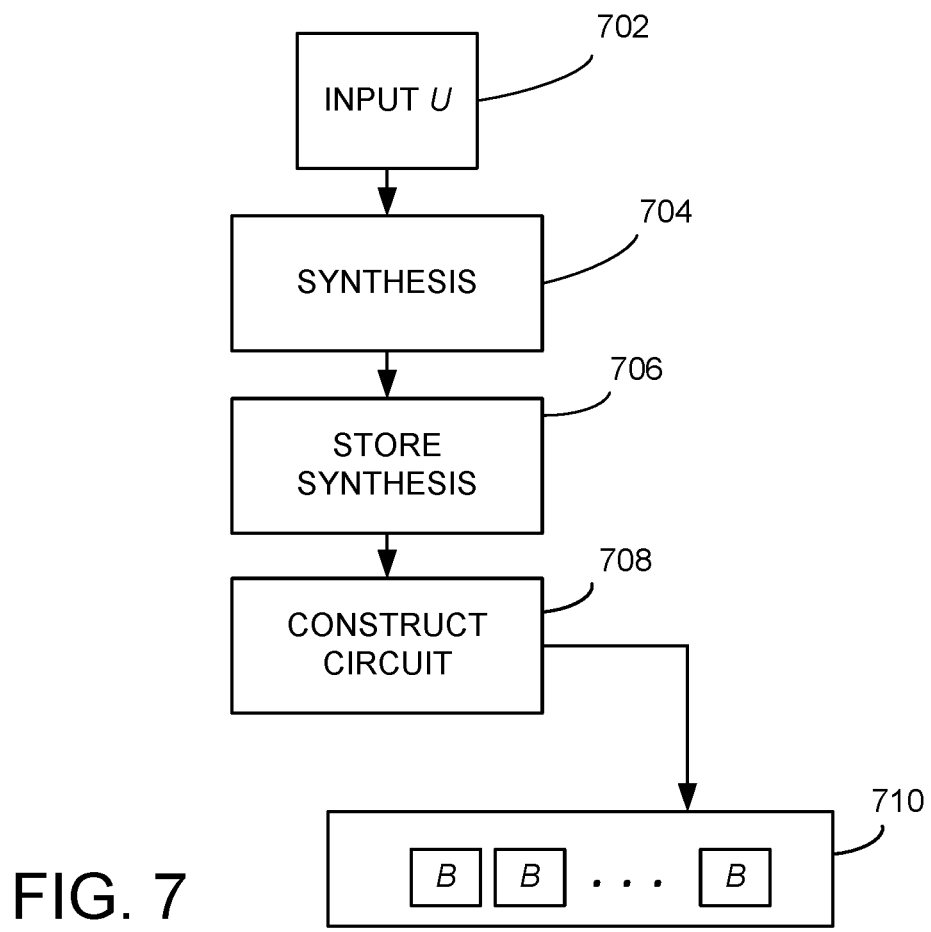
FIG. 7. illustrates a procedure for defining a quantum circuit for implementation of a diagonal unitary over a metaplectic basis.

FIG. 7 illustrates a system that synthesizes a circuit over the metaplectic basis and implements the circuit in a quantum computer. At 702, a circuit U to be synthesized is input. At 704, the circuit is synthesized over a metaplectic basis, with or without ancillas. At 706, the synthesized circuit is stored, and a circuit 710 is constructed at 708, and includes a series of metaplectic basis gates.

Having described and illustrated the principles of the disclosure with reference to the illustrated embodiments, it will be recognized that the illustrated embodiments can be modified in arrangement and detail without departing from such principles. For instance, elements of the illustrated embodiment shown in software may be implemented in hardware and vice-versa. Also, the technologies from any example can be combined with the technologies described in any one or more of the other examples. We therefore claim all subject matter that comes within the scope and spirit of these claims. Alternatives specifically addressed in these sections are merely exemplary and do not constitute all possible alternatives to the embodiments described herein.

The invention claimed is:

1. A computer-implemented synthesis method for quantum computing, comprising:
   with a processor:
   selecting a plurality of metaplectic anyons; and
   defining an asymptotically optimal quantum circuit approximating a selected unitary operator to a desired precision with a series of gates to be applied to the selected plurality of metaplectic anyons, wherein the gates of the series of gates in the quantum circuit are selected from an extended metaplectic basis or from an augmented metaplectic basis that includes gates that generate a finite subgroup of SU(3") and a FLIP gate, wherein the FLIP gate performs the operation FLIP=|0><0|+|1><1|−|2><2|, wherein 0, 1, 2 identify quantum basis states.

2. The method of claim 1, wherein gates of the series of gates in the quantum circuit are selected from the augmented metaplectic basis.

3. The method of claim 2, wherein the series of gates includes a set of gates corresponding to an axial reflection operator.

4. The method of claim 3 wherein the selected unitary is a two-level multi-qutrit unitary, and further comprising generating an intermediate representation as a product of two-level reflections and, based on the intermediate representation, defining the quantum circuit as a series of metaplectic gates and axial reflections.

5. The method of claim 3, further comprising representing the selected unitary as a product of two-level unitaries, and defining the asymptotically optimal quantum circuit based on the representation as a product of two-level unitaries.

6. The method of claim 3, wherein the selected unitary is a multi-qutrit unitary and further comprising representing the multi-qutrit unitary as a product of several two-level unitaries and at most one diagonal unitary.

7. The method of claim 3, further comprising determining whether to define the asymptotically optimal quantum circuit based on exact axial reflections or as an ancilla-assisted circuit based on approximated reflections.

8. A computer-implemented synthesis method for quantum computing, comprising:
   with a processor:
   selecting a plurality of metaplectic anyons; and
   defining an asymptotically optimal quantum circuit approximating a selected unitary operator to a desired precision with a series of gates to be applied to the selected plurality of metaplectic anyons, wherein the gates of the series of gates in the quantum circuit are selected from an extended metaplectic basis or from an augmented metaplectic basis that includes gates that generate a finite subgroup of SU(3") and a FLIP gate, wherein the FLIP gate performs the operation FLIP=|0><0|+|1><1|−|2><2|, wherein 0, 1, 2 identify quantum basis states, wherein the axial reflection operator is an n-qutrit axial reflection operator, wherein n is integer greater than or equal to 2, with a recursively-built exact representation in terms of single-qutrit INC and FLIP gates and two-qutrit SWAP and SUM gates, wherein the INC, FLIP, SWAP, and SUM gates perform the operations INC|j>=|j+1 mod 3>, FLIP=|0><0|+|1><1|−|2><2|, SWAP|j, k>=|k, j>, and SUM|j, k>=|j, (j+k) mod 3, wherein j and k represent quantum basis states and wherein gates of the series of gates in the quantum circuit are selected from the augmented metaplectic basis and the series of gates includes a gate corresponding to an axial reflection operator.

9. A computer-implemented synthesis method for quantum computing, comprising:
   with a processor:
   selecting a plurality of metaplectic anyons; and
   defining an asymptotically optimal quantum circuit approximating a selected unitary operator to a desired precision with a series of gates to be applied to the selected plurality of metaplectic anyons, wherein the gates of the series of gates in the quantum circuit are selected from an extended metaplectic basis or from an augmented metaplectic basis that includes gates that generate a finite subgroup of SU(3") and a FLIP gate, wherein the FLIP gate performs the operation FLIP=|0><0|+|1><1|−|2><2|, wherein 0, 1, 2 identify quantum basis states, wherein if the axial reflection operator is an n-qutrit axial reflection operator for an integer n >5, then n-qutrit axial reflection operator is synthesized as an approximate n-qutrit reflection operator using (n −1) ancillary qutrits, wherein gates of the series of gates in the quantum circuit are selected from the augmented metaplectic basis and the series of gates includes a gates corresponding to an axial reflection operator.

10. A circuit synthesis tool, comprising:
    at least one processor; and
    a memory storing processor-executable instructions for synthesizing a unitary over a metaplectic basis, wherein the memory stores processor-executable instructions for representing a qutrit with coefficients that are Eisenstein rationals and processor-executable instructions for synthesizing the circuit so as to include one or more SUM, SWAP, and axial reflection gates, wherein the SWAP and SUM gates perform the operations SWAP|j, k>=|k, j>, and SUM|j, k>=|j, (j+k) mod 3>, and the axial reflection gates perform one or more of the operations FLIP=|0><0|+|1><1|−|2><2|, |0><0|−|1><2|+|2><2|, −|0><0|+|1><1|+|2><2|, wherein j and k are associated with quantum basis states.

11. The circuit synthesis tool of claim 10, further comprising determining whether to define the asymptotically optimal quantum circuit based on exact axial reflections or as an ancilla-assisted circuit based on approximated reflections.

12. The circuit synthesis tool of claim 11, wherein the memory stores processor-executable instructions for synthesizing an n-qutrit circuit using n-ancillas, wherein n is integer greater than or equal to 2.

13. The circuit synthesis tool of claim 12, wherein the memory stores processor-executable instructions for synthesizing the unitary using at least one two-qutrit entangler.

14. The circuit synthesis tool of claim 10, wherein the memory stores processor-executable instructions for determining if the unitary is to be synthesized without ancillas, and synthesizing the circuit without ancillas based on the determination.

15. The circuit synthesis tool of claim 10, wherein the circuit is synthesized with respect to at least one qudit.

16. A computer implemented quantum circuit synthesis method, comprising:

defining a universal metaplectic basis;

based on a precision and a number of qutrits, determining whether a selected unitary is to be implemented with ancillas or without ancillas;

if synthesis without ancillas is selected, synthesizing the unitary based on a series of SUM, SWAP, and axial reflection gates, wherein the axial reflection gates are represented exactly based on a single-qutrit axial reflection gates, wherein the SWAP and SUM gates perform the operations SWAP|j, k>=|k, j>, and SUM|j, k>=|j, (j+k) mod 3>, and the axial reflection gates perform one or more of the operations FLIP=|0><0|+ |1><1|−|2><2|, |0><0|−|1><1|+|2><2|, −|0><0|+ |1><1|+|2><2|, wherein j and k are associated with quantum basis states; and if synthesis with ancillas is selected and the unitary is an n-qutrit unitary, wherein n is integer greater than or equal to 2, synthesizing the n-qutrit unitary approximately using n ancillas.

* * * * *